United States Patent
Sutardja

(10) Patent No.: US 8,802,554 B2
(45) Date of Patent: Aug. 12, 2014

(54) PATTERNS OF PASSIVATION MATERIAL ON BOND PADS AND METHODS OF MANUFACTURE THEREOF

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 23 days.

(21) Appl. No.: 13/372,315

(22) Filed: Feb. 13, 2012

(65) Prior Publication Data

US 2012/0205812 A1 Aug. 16, 2012

Related U.S. Application Data

(60) Provisional application No. 61/443,190, filed on Feb. 15, 2011.

(51) Int. Cl.
*H01L 21/44* (2006.01)
*H01L 23/485* (2006.01)

(52) U.S. Cl.
CPC .................................. *H01L 23/485* (2013.01)
USPC ....................................................... 438/612

(58) Field of Classification Search
CPC ............................. H01L 23/482; H01L 23/485
USPC ............................................ 257/739; 438/612
See application file for complete search history.

(56) References Cited

U.S. PATENT DOCUMENTS

| | | | | |
|---|---|---|---|---|
| 5,621,246 A * | 4/1997 | Motoyama | .................... | 257/736 |
| 5,723,822 A * | 3/1998 | Lien | .............................. | 174/250 |
| 6,143,396 A * | 11/2000 | Saran et al. | ................... | 428/162 |
| 6,670,708 B2 * | 12/2003 | Choo et al. | .................... | 257/739 |
| 7,420,283 B2 * | 9/2008 | Ito | ................................ | 257/779 |
| 7,888,259 B2 * | 2/2011 | Zbrzezny et al. | ............. | 438/612 |
| 8,026,588 B2 * | 9/2011 | Lee et al. | ...................... | 257/690 |
| 8,148,256 B2 * | 4/2012 | Hebert et al. | ................. | 438/614 |
| 8,409,979 B2 * | 4/2013 | Choi et al. | .................... | 438/613 |
| 2003/0178644 A1 * | 9/2003 | Lee et al. | ...................... | 257/200 |
| 2004/0070042 A1 * | 4/2004 | Lee et al. | ...................... | 257/459 |
| 2011/0169164 A1 * | 7/2011 | Nakamura et al. | ............ | 257/739 |
| 2012/0061835 A1 * | 3/2012 | Hosseini et al. | .............. | 257/739 |

* cited by examiner

*Primary Examiner* — William D Coleman

(57) ABSTRACT

A method includes forming a pad on an electronic component. The pad comprises conductive material. The method further includes providing passivation material on a surface of the conductive material and removing passivation material from the surface to expose portions of the conductive material to form a bond pad comprising conductive material and passivation material.

8 Claims, 6 Drawing Sheets

PATTERNS OF PASSIVATION MATERIAL ON BOND PADS AND METHODS OF MANUFACTURE THEREOF

CROSS REFERENCE TO RELATED APPLICATIONS

This disclosure claims priority to U.S. Provisional Patent Application No. 61/443,190, filed Feb. 15, 2011, the entire specification of which is hereby incorporated by reference in its entirety for all purposes, except for those sections, if any, that are inconsistent with this specification.

TECHNICAL FIELD

Embodiments of the present disclosure relate to the field of semiconductor devices, and more particularly, to techniques, structures, and configurations of bond pads on semiconductor devices, as well as other electrical device components that include bond pads.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic components include semiconductor dies and semiconductor packages, which generally include one or more semiconductor dies and are often referred to as "chips." The semiconductor dies are often supported in the semiconductor packages by another electronic component in the form of a substrate or carrier such as, for example, leadframes that include a plurality of leads. The leads can be utilized to couple the semiconductor package to other electronic components or substrates such as, for example, circuit boards. Alternatively, the semiconductor packages and the semiconductor dies contained therein can be coupled to the other electronic components or substrates in a different manner such as, for example, directly with solder bumps.

In order to provide electrical inter-connections and intra-connections among and between the various electronic components, bond wires are often used. The bond wires are generally coupled to bond pads located on the electronic components. FIG. 1A is a cross sectional view of a semiconductor die 100 that includes a bond pad 102 within a passivation layer 104 on a metal layer 106. As can be seen, the bond pad 102 is exposed and the passivation layer 104 has been fully, or nearly fully, opened at the location of the bond pad 102 to expose the bond pad 102. The bond pad 102 is generally made up of a suitable type of conductive material such as, for example, aluminum. A bond wire 112 to be coupled to the bond pad 102 generally is made up of another conductive material such as, for example, copper or gold. The tip of the bond wire 102 is burned to create an end 114 to be coupled to the bond pad 102. As can be seen in FIG. 1B, the bond wire end 114 is then applied to the bond pad 102 in order to couple the bond wire 110 to the bond pad 102, thereby providing a conductive connection between the bond wire 110 and the bond pad 102. The coupling of the bond wire 112 to the bond pad 102 can be performed while the bond wire end 114 is still soft or molten from the burning that created the bond wire end 114, or through a soldering process that reheats the bond wire end 114.

When the bond wire end 114 is coupled to the bond pad 102, an inter-metallic compound (not illustrated) is formed between the bond wire end 114 and the bond pad 102 to thereby provide a bond between the bond wire end 114 and the bond pad 102. Various tests, such as, for example, reliability tests, are generally performed to test the bonding of the bond wire end 114 to the bond pad 102. Such tests can lead to contamination of the bond between the bond wire end 114 and the bond pad 102 from various irons and/or chemicals, e.g., chlorine. Such contamination can lead to problems with the integrity of the bond between the bond wire end 114 and the bond pad 102 and the inter-metallic compound formed therebetween. Problems with the integrity of the bond can include a potential failure of the bond and/or a separation of the bond wire end 114 from the bond pad 102.

SUMMARY

The present disclosure provides a method that includes forming a pad on an electronic component, wherein the pad comprises conductive material. The method further includes providing passivation material on a surface of the conductive material and removing passivation material from the surface to expose portions of the conductive material to form a bond pad comprising conductive material and passivation material.

The present disclosure also provides an electronic component that includes a bond pad, wherein the bond pad comprises conductive material and passivation material. The conductive material and the passivation material are arranged such that a contact surface of the bond pad is substantially non-smooth and defines peaks and valleys.

The present disclosure also provides a method that includes providing passivation material at a location on an electronic component, wherein the passivation material is arranged in a pattern that exposes portions of the electronic component at the location. The method also includes depositing a conductive material over the passivation material at the location to provide a bond pad that includes the passivation material at the location, wherein a contact surface of the bond pad is substantially non-smooth and defines peaks and valleys.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION

Figure 1A:
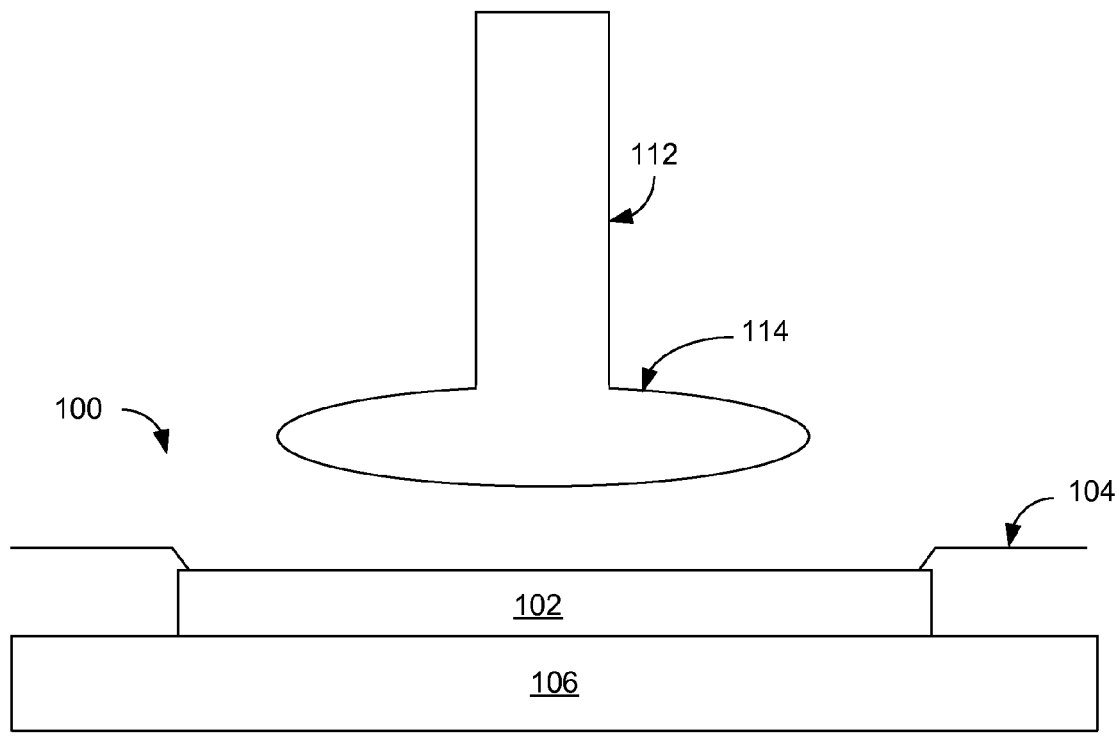
FIGS. 1A and 1B are cross-sectional views that schematically illustrate a prior art arrangement for bonding a bond wire to a bond pad.
Figure 1B:
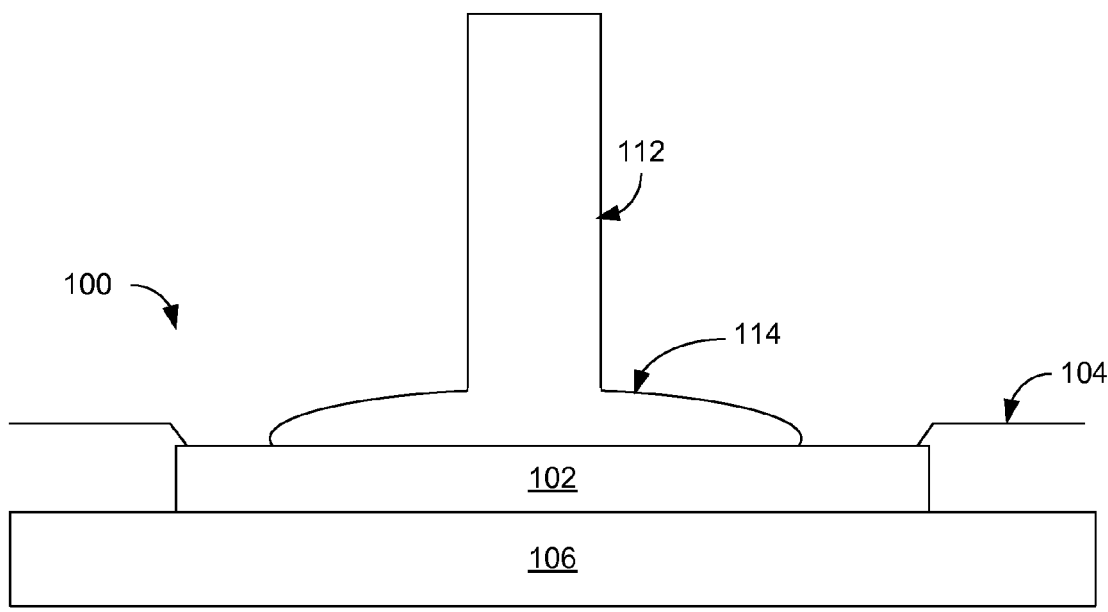
Figure 2A:
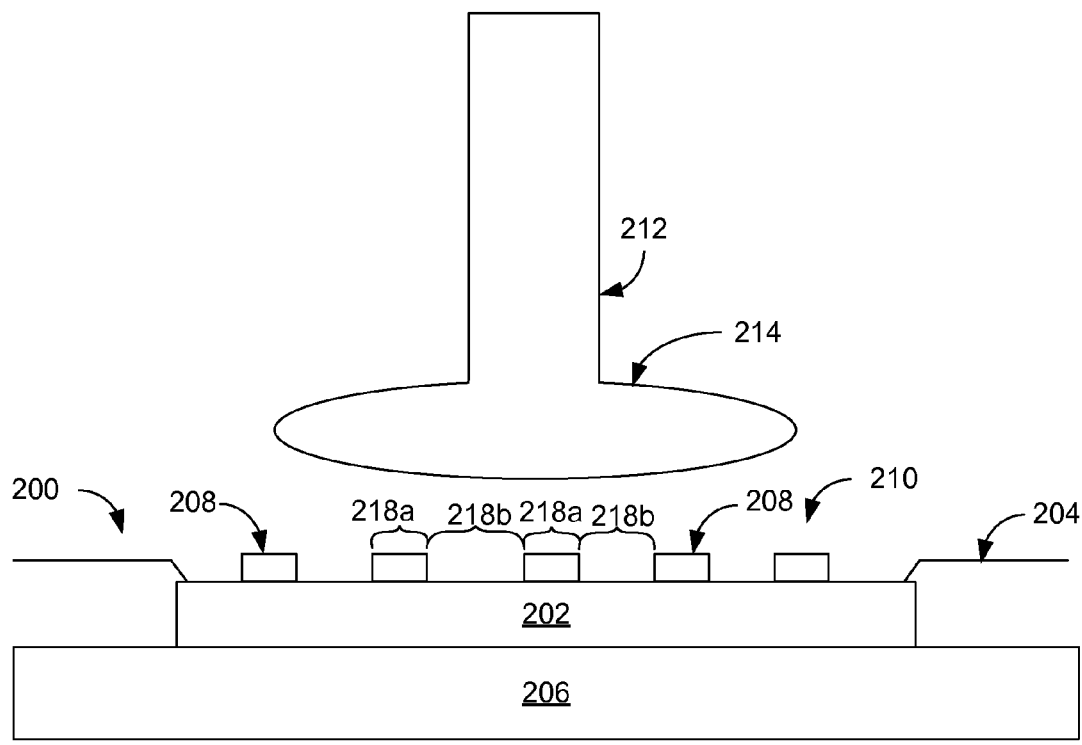
FIGS. 2A and 2B are cross-sectional views that schematically illustrate an embodiment of an arrangement for bonding a bond wire to a bond pad.

FIG. 2A is a cross sectional view of a semiconductor die 200 that includes a pad 202 formed within a passivation layer 204 on a layer 206. While the semiconductor die 200 generally includes more layers, such additional layers are not illustrated for clarity and ease of understanding. The layer 206 generally is made up of a material such as, for example, silicon, copper (Cu), aluminum (Al), aluminum-copper alloy, aluminum-silicon alloy, nickel (Ni), or the like. The pad 202 generally comprises a conductive material such as, for example, gold, copper (Cu), aluminum (Al), aluminum-copper alloy, aluminum-silicon alloy, nickel (Ni), or the like, that is generally different from the material that makes up the layer 206. The passivation layer 204 may be formed with any suitable passivation material including, for example, oxide, nitride, silicon-oxide, silicon-nitride, or the like.

In accordance with various embodiments, the pad 202 includes spacers 208 on a top surface of the pad 202 to thereby form a bond pad 210. Spacers 208 can be made up of passivation material or other hard materials. Examples of passivation material include, for example, silicon-nitride, oxide, nitride, silicon-oxide, or the like as mentioned for the passivation layer 204. The spacers 208 may be provided on the pad 202 by forming the pad 202 on the layer 206 prior to depositing the passivation layer 204. The passivation layer 204 may then be etched to expose the pad 202. However, in accordance with various embodiments, portions of the passivation layer 204 are left on the pad 202. This can be accomplished in a manner known in the art such as, for example, providing a masking layer (not illustrated) on the pad 202 prior to deposition of the passivation layer 204, which thereby facilitates the removal of portions of the passivation layer 204 from the surface of the pad 202 during the etching process. As another example, thin films (not illustrated) can be provided on the pad 202 prior to depositing the passivation material to form the passivation layer 204. For example, a photo-resist film (or any other appropriate material) can be deposited to cover substantially the entire top surface of the pad 202. The photo-resist film can then be selectively etched to expose the sections of the top surface of the pad 202 where spacers 208 are desired. Passivation material is selectively deposited on the top surface of the pad 202 through the etched photo-resist film. Passivation material is not deposited on the sections of the top surface of the pad 202 that are covered by the photo-resist film. The portions of passivation layer 204 or passivation material that remain on the pad 202 are represented as spacers 208 in FIG. 2A.

In accordance with various embodiments, the spacers 208 can be added to the pad 202 separately from the formation of the passivation layer 204. For example, the pad 202 can be formed on the layer 206 and the passivation layer 204 can be formed over the pad 202 and the layer 206. The passivation layer 204 can be fully, or nearly fully, opened to expose the pad 202. Spacers 208 to be included on the pad 202 can then be added separately to the pad 202. Portions of the passivation material can be removed from the pad 202 to thereby form spacers 208 on the pad 202. The passivation material can be removed with any suitable process, such as, for example, an etching process or a thin film process as previously mentioned.

As can be seen in FIG. 2A, the pad 202 and the spacers 208 collectively form a bond pad 210. The bond pad 210 is non-smooth or non-flat and defines a plurality of peaks 218a and a plurality of valleys 218b (although only a few of the plurality of peaks and valleys are labeled in FIG. 2A for purposes of clarity). The plurality of peaks 218a and the plurality of valleys 218b define a contact surface of the bond pad 210. While the spacers 208 are illustrated in cross-section in FIGS. 2A and 2B as having a substantially square shape, this is not meant to be limiting and other shapes are possible.

Figure 2B:
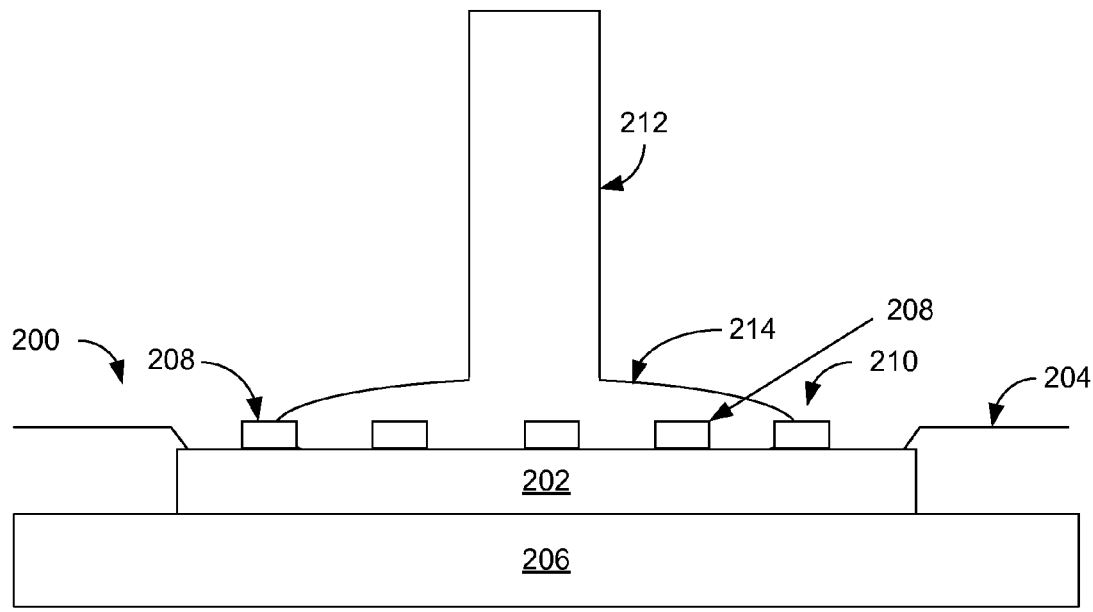

Referring to FIG. 2B, once the bond pad 210 is completed, a bond wire 212 may be coupled to the bond pad 210. The bond wire 212 generally is made up of a conductive material such as, for example, gold, copper (Cu), aluminum (Al), aluminum-copper alloy, aluminum-silicon alloy, nickel (Ni), or the like, but is generally different from the material that makes up the bond pad 210. An end 214 of the bond wire 212 is coupled to the bond pad 210 either immediately after the formation of the bond wire end 214 (while the bond wire end 214 is still soft or molten from the burning of bond wire 212 that created the bond wire end 214) or through a suitable solder process. The bond wire end 214 thereby couples or bonds to the bond pad 210 by filling in valleys 218b between the peaks 218a. An inter-metallic compound (not illustrated) is formed in between the spacers 208 to thereby bond the bond wire end 214 to the bond pad 210. While FIG. 2B illustrates the bond wire end 214 as not completely covering the bond pad 210, in accordance with various embodiments, the bond wire end 214 can entirely cover or substantially cover the bond pad 210. Likewise, the bond wire end 214 can cover less of the bond pad 210 if desired.

During and/or after testing of the bond formed between the bond wire end 214 and the bond pad 210, contaminants such as, for example, irons and/or chemicals (e.g., chlorine) from the testing process, may begin to interfere with or harm the integrity of the bond formed between the bond wire end 214 and the bond pad 210 by moving through the bond formed between the bond wire end 214 and the bond pad 210. As the contaminants move along the bond formed between the bond wire end 214 and the bond pad 210, the contaminants will encounter the spacers 208 on the bond pad 210. Spacers 208 prevent the further spread of the contaminants through the bond formed between the bond wire end 214 and the bond pad 210. This can lead to the integrity of the bond remaining intact and strong, thus preventing failure of the bond between the end of the bond wire 214 and the bond pad 210. Also, since the spacers 208 and the peaks 218a and valleys 218b provide a contact surface that is non-smooth or non-flat, adhesion between the bond wire end 214 and the bond pad 210 is improved.

Figure 3A:
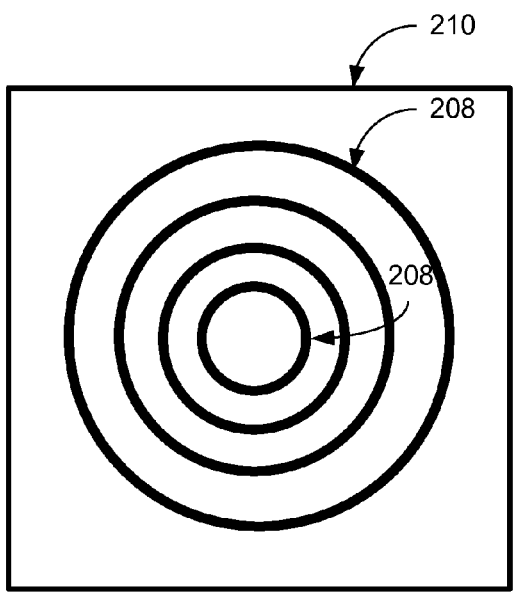
FIGS. 3A-3D are top views illustrating examples of patterns of passivation material for bond pads described herein.
Figure 3C:
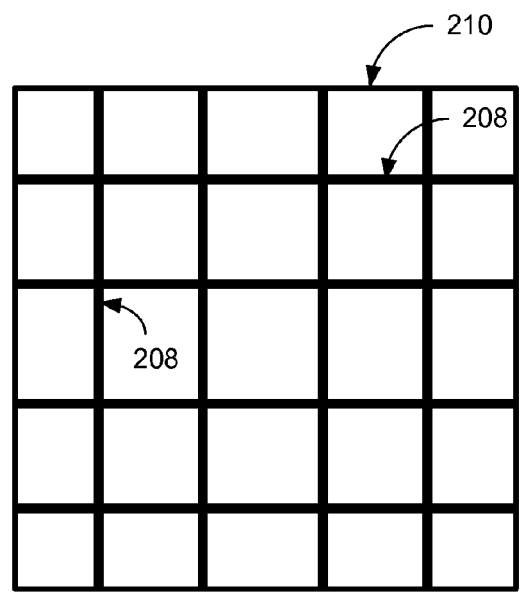
Figure 3B:
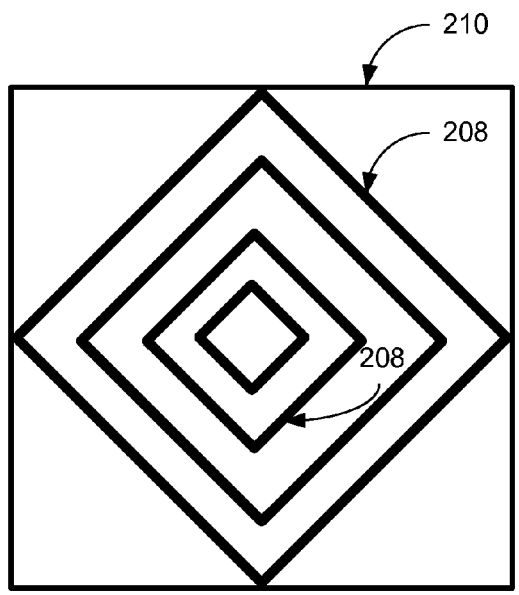
Figure 3D:
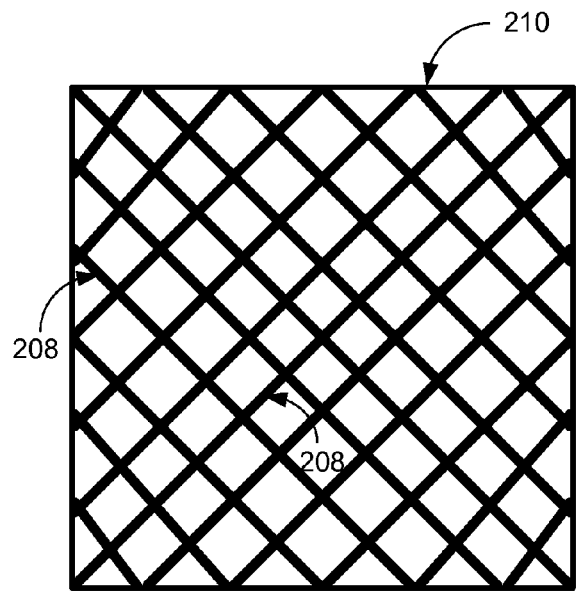

In accordance with various embodiments, the spacers 208 on the bond pad 210 are arranged in a pattern. FIGS. 3A-3D are top views of a die pad 210 spacers 208 arranged in various examples of patterns. As can be seen, the examples include circles within circles (FIG. 3A), squares within squares (FIG. 3B), a checkerboard-type pattern (FIG. 3C) and a diagonal checkerboard-type pattern (FIG. 3D). These examples of patterns are not meant to be limiting and the scope of the present disclosure is not intended to be thereby limited. Additionally, while the bond pad 210 is illustrated as substantially square, other shapes, for example, such as round, rectangular, triangular, etc. are possible for the bond pad 210. Likewise, other shapes are possible for creating the patterns (e.g., circles or triangles may be used to create the checkerboard-type patterns).

Figure 4A:
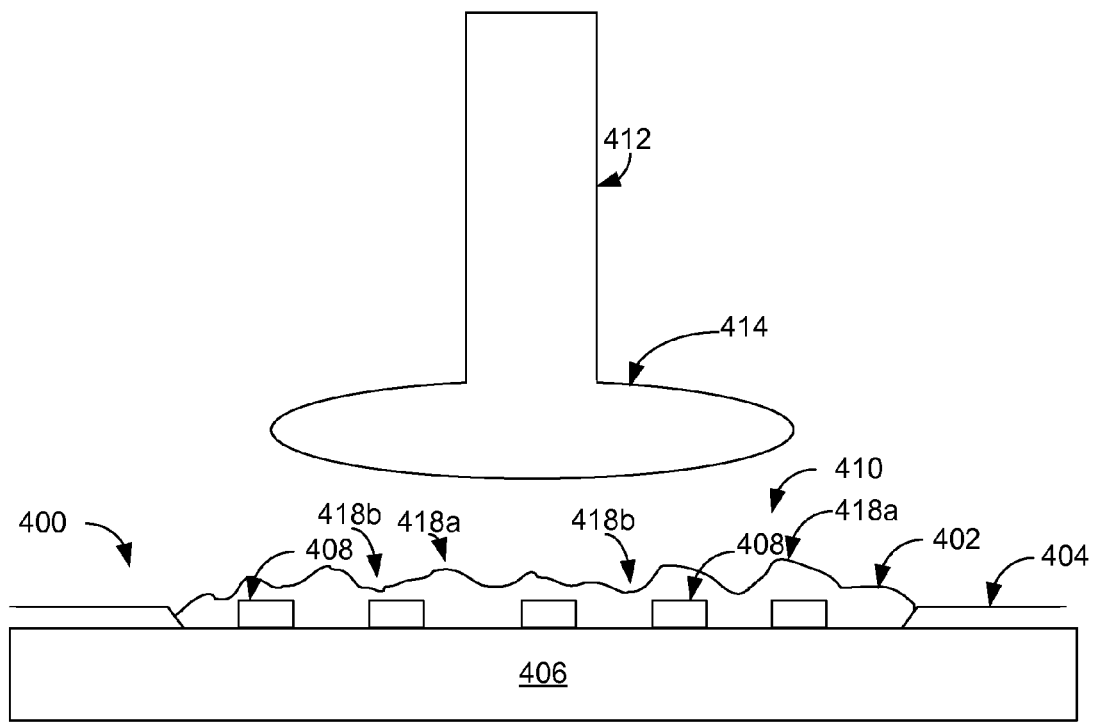
FIGS. 4A and 4B are cross sectional views that schematically illustrate another embodiment of an arrangement for bonding a bond wire to a bond pad.
Figure 4B:
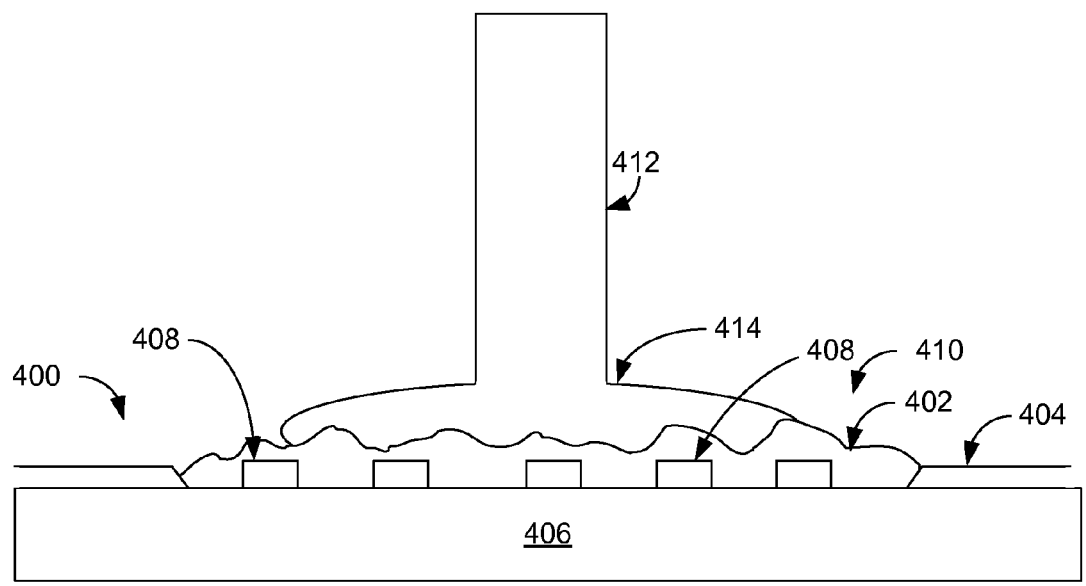

FIGS. 4A and 4B are cross-sectional views of a semiconductor die 400 that includes another embodiment of a bond pad 410 that includes spacers 408. In this embodiment, the spacers 408 are provided directly on a layer 406 prior to the formation of the bond pad 410. The spacers 408 can be formed on the layer 406 in a manner as previously described. The spacers 408 can be formed in a pattern as previously described, if desired. The layer 406 generally is made up of a material such as, for example, silicon, copper (Cu), aluminum (Al), aluminum-copper alloy, aluminum-silicon alloy, nickel (Ni), or the like. The spacers 408 may be made up of any suitable passivation material including, for example, oxide, nitride, silicon-oxide, silicon-nitride, or the like. While the spacers 408 are illustrated in cross-section in FIGS. 4A and 4B as having a substantially square shape, this is not meant to be limiting and other shapes are possible.

Once the spacers 408 are in place at the location where a bond pad 410 is desired on the layer 406, a conductive material 402, such as, for example, gold, copper (Cu), aluminum (Al), aluminum-copper alloy, aluminum-silicon alloy, nickel (Ni), or the like, is deposited over the spacers 408 to form a bond pad 410 that includes the spacers 408. The conductive material 402 is generally different from the material that makes up the layer 406.

As can be seen in FIG. 4A, a top surface of the conductive material 402 is generally non-smooth or non-flat and thus defines a contact surface that generally defines a plurality of peaks 418a and a plurality of valleys 418b (although only a few of the plurality of peaks and valleys are labeled in FIG. 4A for purposes of clarity). As can be seen in FIG. 4B, an end 414 of a bond wire 412 may be coupled to the bond pad 410 at the contact surface as previously described with respect to FIGS. 2A and 2B. A bond wire end 414 fills in valleys 418b between the peaks 418a to thereby bond the bond wire end 414 to the bond pad 410. This can lead to a stronger bond between the bond wire end 414 and the bond pad 410. Additionally, the spacers 408 within the conductive material 402 can prevent spread of contaminants within the bond between the bond wire end 414 and the bond pad 410 that may result from reliability testing of the bond between the bond wire end 414 and the bond pad 410. Also, the spacers 408 and the peaks 418a and valleys 418b collectively provide a non-smooth or non-flat contact surface, thereby improving adhesion between the bond wire end 414 and the bond pad 410. Since the spacers 408 are made of passivation material or other hard materials, such as, silicon-nitride, the spacers 408 may act as structural support against the bond wire end 414. When the bond wire end 414 is pressed against the conductive material 402, the spacers 408 ensure that sufficient conductive material 402 remains between the bond wire end 414 and the layer 406. The space between two adjacent spacers 408 may be used to trap the conductive material 402, thereby maintaining adhesion and connection.

While FIG. 4B illustrates the bond wire end 414 as not completely covering the bond pad 410, in accordance with various embodiments, the bond wire end 414 can entirely cover or substantially cover the bond pad 410. Likewise, the bond wire end 414 can cover less of the bond pad 410 if desired.

While the bond pads 210, 410 have been described as being coupled to a layer, e.g., layers 206, 406 of semiconductor dies 200, 400, the bond pads 210, 410 may be formed on another type of arrangement. For example, the bond pads 210, 410 may be located on through-silicon vias (TSVs). Additionally, while the present disclosure describes the bond pads 210, 410 as being included or defined on semiconductor dies 200, 400, the bond pads 210, 410 can be included on other types of electronic components such as, for example, semiconductor packaging arrangements, substrates (including, but not limited to, leadframes, circuit boards, etc.), etc. The bond pads 210, 410 and bond wires 212, 412 can be used to provide intra-connections on various electronic components such as, for example, semiconductor dies, semiconductor packages and substrates (such as, for example, leadframes and circuit boards). The bond pads 210, 410 and bond wires 212, 412 can also be used to provide inter-connections between various electronic components such as, for example, semiconductor dies, semiconductor packages and substrates (such as, for example, leadframes and circuit boards).

Figure 5:
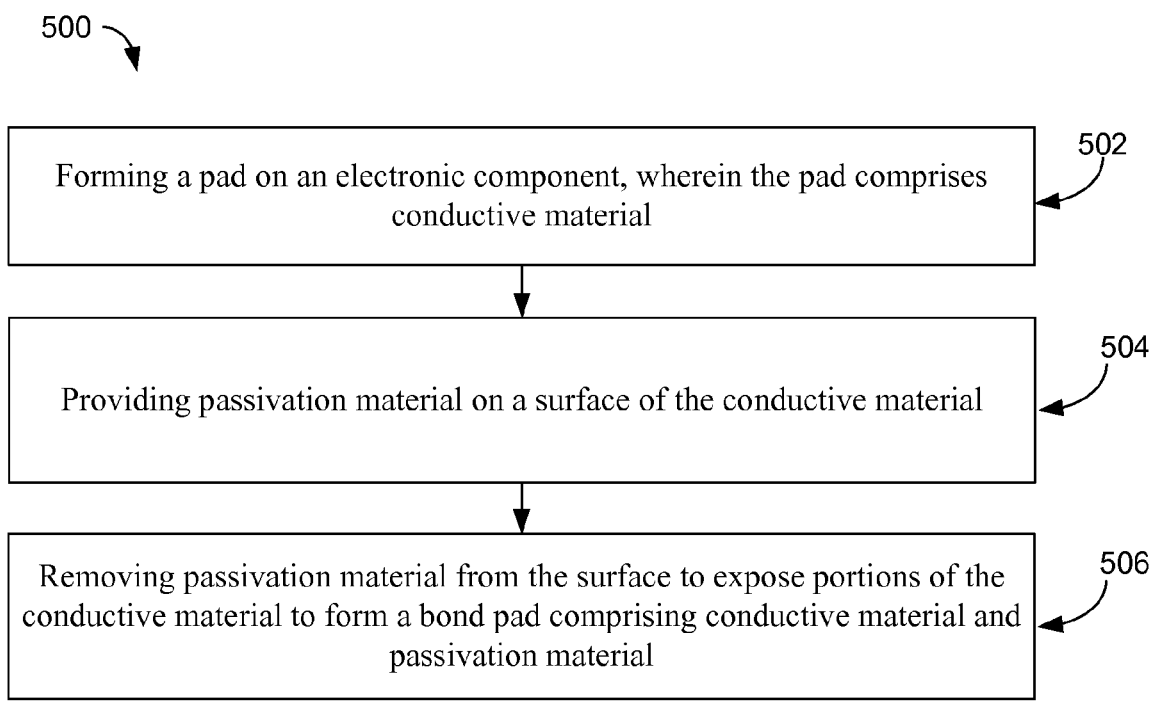
FIGS. 5 and 6 are process flow diagrams of example methods to fabricate bond pads described herein.

FIG. 5 is a flow diagram for an example of a method 500 fabricating a bond pad 210. At 502, the method 500 includes forming a pad on an electronic component, wherein the pad comprises conductive material. At 504, the method 500 includes providing passivation material on a surface of the conductive material. At 506, the method 500 further includes removing passivation material from the surface to expose portions of the conductive material to form a bond pad comprising conductive material and spacers. The spacers are made up of passivation material that remains on the surface of the conductive material.

Figure 6:
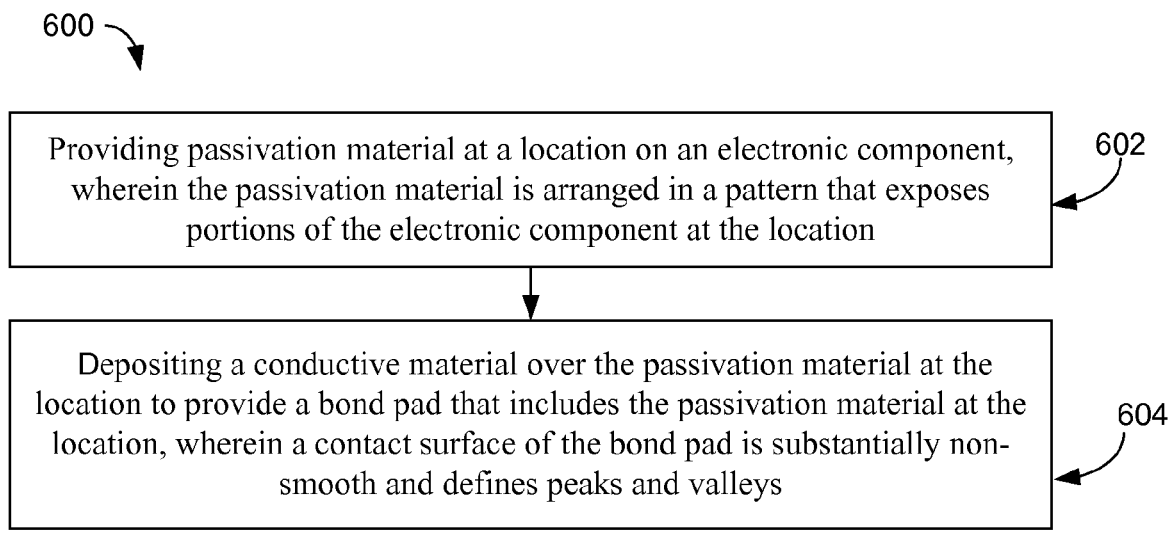

FIG. 6 is a flow diagram for an example of a method 600 for fabricating a bond pad 410. At 602, the method 600 includes providing passivation material at a location on an electronic component, wherein the passivation material is arranged in a pattern that exposes portions of the electronic component at the location. At 604, the method 600 includes depositing a conductive material over the passivation material at the location to provide a bond pad that includes the passivation material at the location, wherein a contact surface of the bond pad is substantially non-smooth or non-flat and defines peaks and valleys.

The description may use perspective-based descriptions such as over/under. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:
1. A method comprising:
    forming a pad on an electronic component, wherein the pad comprises conductive material;
    providing passivation material on a surface of the conductive material;

selectively removing the passivation material from the surface of the conductive material to expose a section of the conductive material; and subsequent to selectively removing the passivation material from the surface of the conductive material to expose the section of the conductive material, depositing a plurality of spacers on the exposed section of the conductive material to form a bond pad comprising (i) the conductive material and (ii) the plurality of spacers.

2. The method of claim 1, wherein:
the plurality of spacers include a pattern of material deposited on the pad.

3. The method of claim 1, wherein the passivation material includes silicon nitride.

4. The method of claim 1, wherein forming the pad on the electronic component and providing the passivation material on the surface of the conductive material comprises:
providing the pad on a layer of the electronic component; and
depositing the passivation material on (i) the pad and (ii) the layer to define a passivation layer of the electronic component.

5. The method of claim 1, wherein forming the pad on the electronic component and providing the passivation material on the surface of the conductive material comprises:
depositing the passivation material on a layer of the electronic component to define a passivation layer of the electronic component;
selectively removing the passivation material to expose a location on the layer to create the pad;
depositing the conductive material at the location; and
depositing passivation material on the conductive material.

6. The method of claim 2, further comprising:
coupling a bond wire to the bond pad such that the bond wire is in physical contact with (i) the pad and (ii) the plurality of spacers, wherein the pattern comprises at least one of (i) straight lines and (ii) curved lines.

7. The method of claim 6, wherein the pattern comprises at least one of a plurality of (i) squares and (ii) circles.

8. The method of claim 6, wherein the pattern comprises one of (i) a checkerboard-type pattern, (ii) a diagonal checkerboard-type pattern, (iii) squares within squares, and (iv) circles within circles.

* * * * *